(12) United States Patent
Khan et al.

(10) Patent No.: US 7,023,196 B2
(45) Date of Patent: Apr. 4, 2006

(54) HIGH LEVEL ARC FAULT DETECTOR

(75) Inventors: Imtiaz Khan, Trabuco Canyon, CA (US); Malcolm Critchley, Scottsdale, AZ (US)

(73) Assignee: Leach International Corporation, Buena Park, CA (US)

( * ) Notice: Subject to any disclaimer, the term of this patent is extended or adjusted under 35 U.S.C. 154(b) by 8 days.

(21) Appl. No.: 10/734,927

(22) Filed: Dec. 12, 2003

(65) Prior Publication Data
US 2005/0127922 A1    Jun. 16, 2005

(51) Int. Cl.
*G01R 31/02* (2006.01)
*H02H 9/08* (2006.01)

(52) U.S. Cl. .............. 324/158; 324/521; 324/536; 361/20; 361/50

(58) Field of Classification Search ............ 356/72–73, 356/432–433; 324/158, 521; 361/20, 50, 361/96–97, 105, 42, 87
See application file for complete search history.

(56) References Cited

U.S. PATENT DOCUMENTS

| | | | | |
|---|---|---|---|---|
| 3,700,967 A | * | 10/1972 | Hoss ........................... 361/46 |
| 3,982,158 A | * | 9/1976 | Knauer ........................ 361/87 |
| 4,333,119 A | * | 6/1982 | Schoenmeyr ................ 361/76 |
| 4,347,541 A | * | 8/1982 | Chen et al. .................. 361/50 |
| 4,571,659 A | * | 2/1986 | Demeyer et al. ............. 361/95 |
| 4,589,050 A | * | 5/1986 | Cutler et al. ................. 361/86 |
| 4,673,888 A | * | 6/1987 | Engelmann et al. .......... 330/10 |
| 4,777,579 A | * | 10/1988 | Jahns et al. .................. 363/98 |
| 4,862,308 A | * | 8/1989 | Udren ......................... 361/45 |
| 4,973,902 A | * | 11/1990 | Dhyanchand et al. ....... 324/772 |
| 5,933,305 A | * | 8/1999 | Schmalz et al. ............. 361/42 |

* cited by examiner

*Primary Examiner*—Gregory J. Toatley, Jr.
*Assistant Examiner*—Sang H. Nguyen
(74) *Attorney, Agent, or Firm*—Christie, Parker & Hale, LLP

(57) ABSTRACT

Apparatus and methods for detecting high level arc faults in aircraft power systems are disclosed. One embodiment of the invention with reduced susceptibility to nuisance trips includes three low pass filters each having an output connected to a threshold detector. In addition, a three input comparator is connected to an output of each of the threshold detectors and a fault verification circuit is connected to an output of the three input comparator. An embodiment of the method of the invention for detecting arc faults in three phase aircraft power systems involves detecting at least one of the three phases having a current exceeding a predetermined threshold, detecting differences between the three phases and generating a signal indicative of difference being detected between the three phases for a time period exceeding a predetermined duration.

11 Claims, 5 Drawing Sheets

HIGH LEVEL ARC FAULT DETECTOR

BACKGROUND OF THE INVENTION

The present invention relates generally to arc fault detection in three phase aircraft power systems and more specifically, to the detection of high level arc faults in these systems.

Increasing age of aircraft used by the aviation industry has prompted many improvements to existing designs and retrofits to improve aircraft safety. A number of fires aboard aircraft have prompted considerable review of the safety of aircraft electrical systems. These reviews have identified arc fault in aircraft power systems as a pressing safety concern. An arc fault is a self sustaining discharge of electricity in a highly conductive ionized gas that results in unintended current flow between conductors. Causes of arc faults in aircraft include wire chafing, dust build up and moisture. The current generated by an arc is limited by the parameters of the circuits to which the conductors belong. High level arcs result when the current generated by the arc exceeds the load current of the circuit. The circuit load current is the current supplied to the load, when the system is in a steady state and in the absence of any faults. High level arcs can also be characterized by imbalances or differences between the three current phases. Arcs generating currents that do not exceed the circuit load current are referred to as low level arcs.

Where possible, the aviation industry has relied upon aircraft circuit breakers to protect against arc faults. These devices are typically designed to protect wiring from thermal damage that occurs during an over-current situation. In three phase aircraft power systems, such as the 115V, 400 Hz, three phase electrical systems used on many aircraft, an arc fault can add to an existing load current causing a fast three-phase imbalance. This fast three phase imbalance is often too short lived to be detected by many aircraft circuit breakers. Research has shown that arc faults giving rise to temperatures as high as 6000° C. can go undetected by aircraft circuit breakers.

SUMMARY OF THE INVENTION

Embodiments of the present invention can provide an improved method of detecting high level arc faults in three phase aircraft power systems. Several embodiments of the invention include digital logic to detect imbalances between the three phase currents.

One embodiment that detects arc faults in three phase aircraft power systems includes three full wave rectifiers each having an output connected to a threshold detector, a three input comparator connected to an output of each of the threshold detectors and a fault verification circuit connected to an output of the three input comparator. In another embodiment, the threshold detectors include a first comparator having a first input connected to an output of one of the full wave rectifiers, a second input connected to a signal indicative of a predetermined threshold and an output. In other embodiments, threshold detectors further include an integrator configured to integrate the output of the first comparator.

In a further embodiment, the three input comparator is configured to generate a signal indicative of the outputs of any two of the threshold detectors differing by more than a predetermined amount. In yet another embodiment, the fault verification circuit includes an integrator connected to the output of the three input comparator and a comparator connected to the output of the integrator and configured to generate a signal indicative of the detection of a fault, when the output of the integrator exceeds a predetermined threshold.

An embodiment of the method of the invention includes detecting at least one of the three phases having a current exceeding a predetermined threshold, detecting differences between the three phases and generating a signal indicative of differences being detected between the three phases for a time period exceeding a predetermined duration. In other embodiments, the method further includes generating signals indicative of each of the three phases and generating a signal indicative of at least two of the three signals differing by more than a predetermined amount. In another embodiment of the method, the detection of differences includes continuously monitoring the signals indicative of the three phases.

In a further embodiment of the method of the invention, generating a signal indicative of at least two of the three signals differing by more than a predetermined amount, further includes integrating each of the signals indicative of each of the three phases over at least one cycle and generating signals indicative of each of the three phases further includes comparing the magnitude of each phase to a predetermined threshold and generating a signal for each phase indicative of the magnitude of the signal relative to the threshold.

In yet another embodiment of the method, the detection of differences further comprises continuously sampling the signals indicative of the three phases. In a still further embodiment of the method, generating a signal indicative of differences being detected between the three phases for a time period exceeding a predetermined duration further includes generating a signal indicative of the time period during which at least two of the three phases differ by more than a predetermined amount and comparing the generated signal to a signal indicative of the predetermined duration.

DETAILED DESCRIPTION OF THE INVENTION

Figure 1:
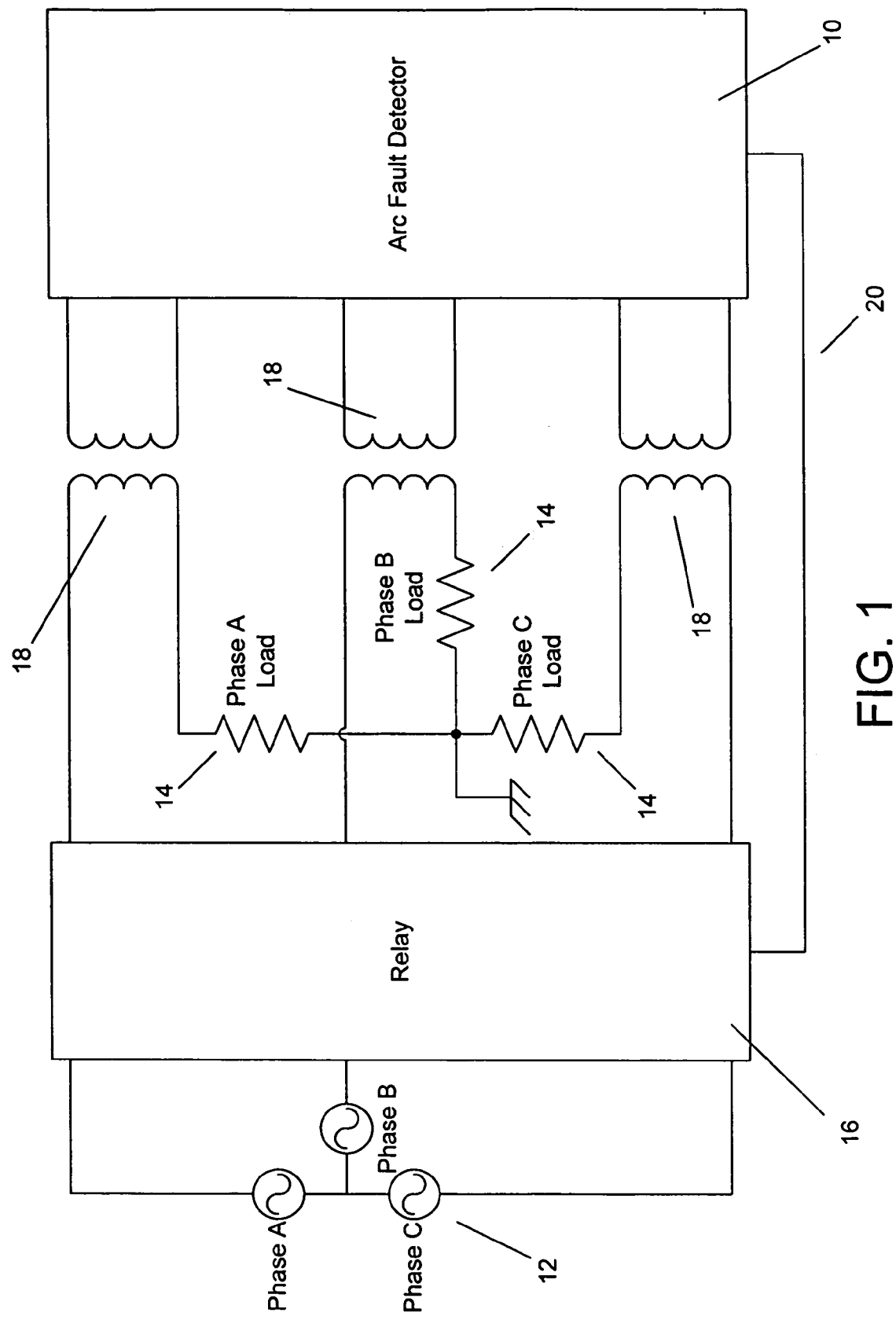
FIG. 1 is a schematic view of an arc fault detector constructed in accordance with the present invention configured to monitor three phase load currents supplied by a relay.

Referring to the drawings, an arc fault detector 10 constructed in accordance with one embodiment of the present invention is adapted to monitor a three phase load current supplied by a power supply 12 to a load 14 via a relay 16. The arc fault detector uses current transformers 18 to enable continuous monitoring of the three phase load currents. The arc fault detector monitors the three current phases for events involving at least one of the phases exceeding the system load current and the phases differing by an amount greater than a predetermined margin. If the excessive current and the difference between phases continues for a predetermined time period, the arc fault detector assumes that a high level arc has occurred and responds by opening the relay to deprive the load of current.

An arc fault detector 10 in accordance with the present invention that is adapted to monitor a three phase load current is illustrated in FIG. 1. The three phase load current is generated by a power supply 12 and is provided to the load 14 in a controlled manner by a relay 16. Each phase of the load current is monitored using a current transformer 18. Connecting one coil of a current transformer between the relay and the load and connecting the other coil to the arc fault detector provides a signal to the arc fault detector indicative of one of the phases of the load current, without requiring that the arc fault detector directly monitor the current via an electrical connection. Isolating the arc fault detector from the current is beneficial as it avoids damage to the detector that can result from current surges.

The arc fault detector responds to current surges having specific characteristics associated with high level arc faults. As described above, high level faults are characterized by currents exceeding the system load current and by imbalances between the three phases of the load current. A complication associated with detecting high level arc faults is that currents in excess of the system load current and current imbalances can result from current in-rush, when the load is connected to the power supply by the relay. The arc fault detector of the present invention avoids nuisance tripping due to current in-rushes by monitoring the load current for a sufficient time to distinguish between a brief imbalance resulting from current in-rush and a persisting imbalance caused by an arc fault. The arc fault detector responds to a persistent imbalance by generating a signal indicating that the relay should open, which is provided to the relay by the connection 20.

In one embodiment, the arc fault detector is used to monitor the current provided to high current load devices such as motors, fans and hydraulic or fuel pumps. In other embodiments, the arc fault detector is used to provide protection to any device connected to a power source by a low impedance bus.

Figure 2:
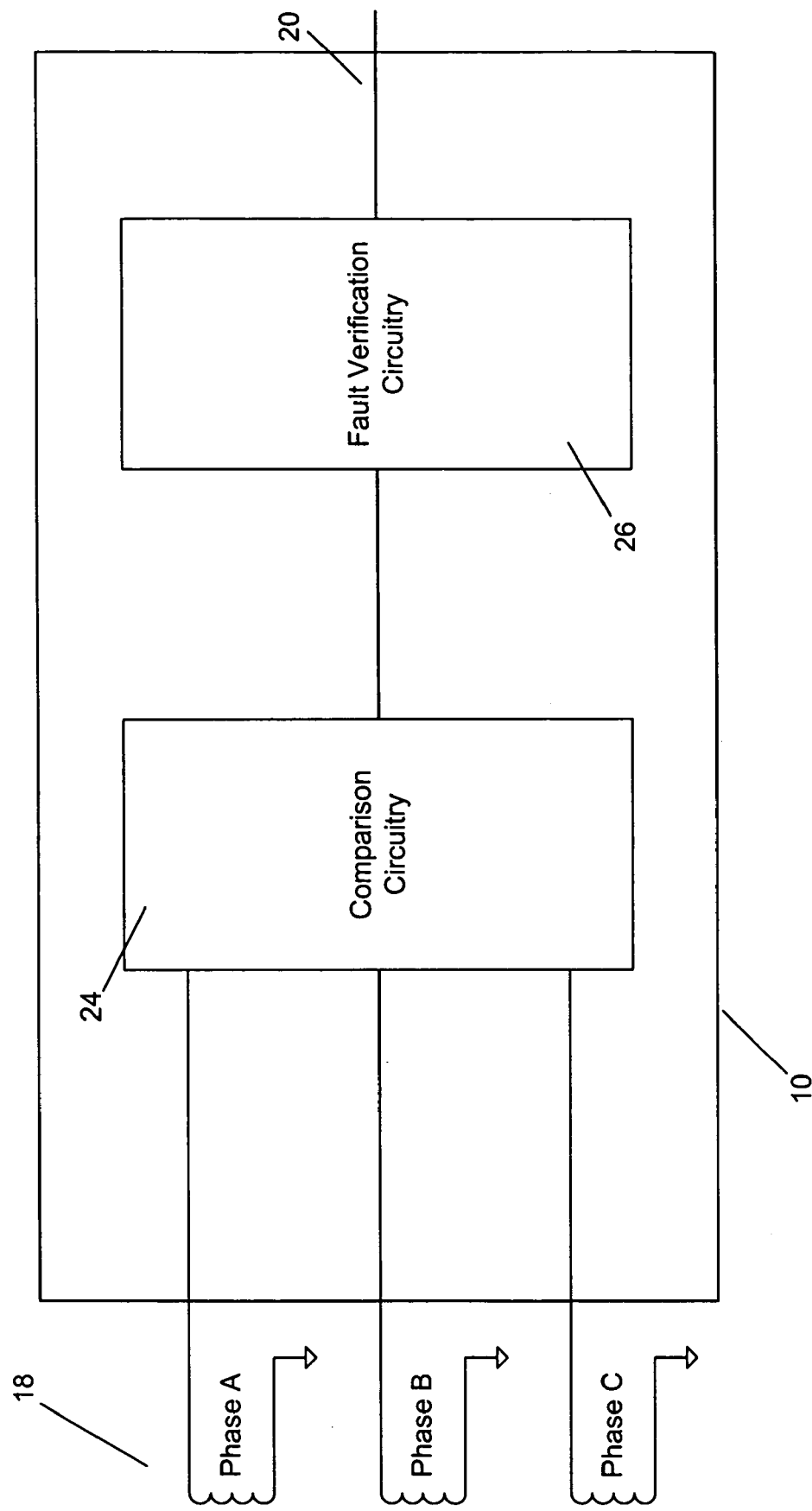
FIG. 2 is a schematic view of components of an arc fault detector constructed in accordance with the present invention.

An embodiment of an arc fault detector in accordance with the present invention is illustrated in FIG. 2. The arc fault detector includes comparison circuitry 24. An output from the comparison circuitry is provided to fault verification circuitry 26. The comparison circuitry performs the function of comparing the characteristics of the three current phases. In one embodiment the comparison circuitry determines if any of the phases exceed a predetermined threshold indicative of a high level arc and if imbalances exist between the current phases that are also indicative of a high level arc. If both these conditions are determined to be present, then a signal is provided to the fault verification circuitry indicative of the presence of a potential fault. The fault verification circuitry 26 monitors the output of the comparison circuitry 24 to prevent nuisance tripping. In one embodiment, the fault verification circuitry prevents nuisance tripping by timing the duration of the potential fault indicated by the output of the comparison circuitry. If the potential fault persists beyond a predetermined time period, the fault verification circuitry assumes that the potential fault is an actual arc fault and generates an output signal indicating the presence of an arc fault. Similar circuitry can also be used to detect arc faults by comparing the rate of change of voltage against a known reference, by measuring the number, type or deformities that are present in zero crossings or by observing randomness in the shape of the load current waveform. In addition, the circuitry described above can be replaced entirely or in part by a microprocessor configured with appropriate software.

In one embodiment for loads having a maximum current of 60 A, the predetermined threshold used by the comparison circuitry is 150% of the system load current and the tolerated current imbalance is 1%. In addition, the fault verification circuitry uses a predetermined time period of approximately 80 milliseconds. One skilled in the art will appreciate that the choice of the predetermined threshold, current imbalance tolerance and predetermined time period are application and system load current dependent. A factor to be considered in establishing predetermined thresholds and time periods is that these two parameters are related. If a higher predetermined threshold is used, then the current will exceed this threshold in the absence of a fault for a shorter time. Therefore, the pre-determined time period can be reduced.

Figure 3:
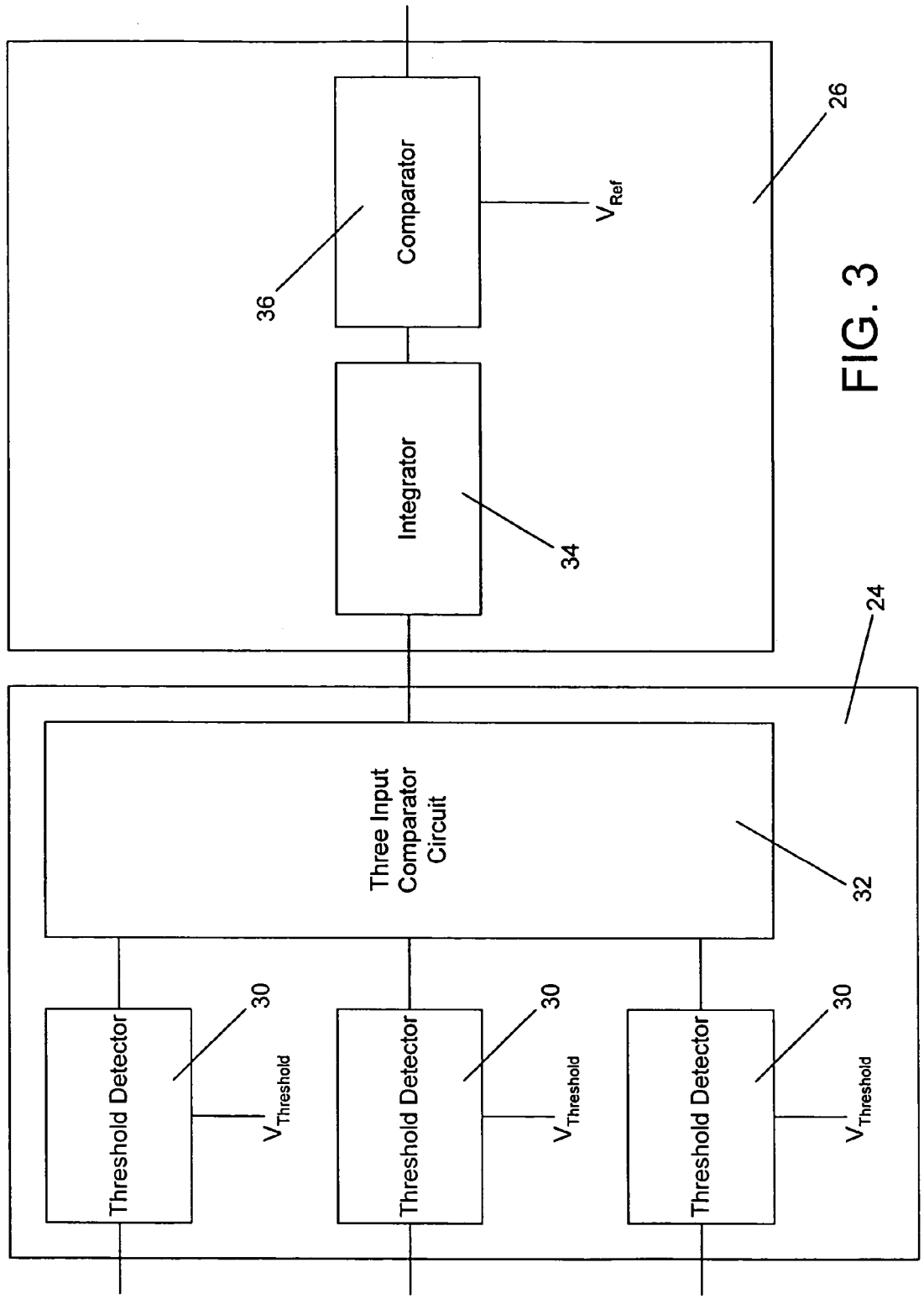
FIG. 3 is a schematic view of the components used to construct embodiments of comparison circuitry and fault verification circuitry.

Embodiments of the comparison circuitry and the fault verification circuitry are illustrated in FIG. 3. The comparison circuitry 24 includes three threshold detectors 30 connected to a three input comparator 32. The fault verification circuit includes an integrator 34 connected to a comparator 36.

The threshold detectors indicate whether a signal provided at an input exceeds a predetermined threshold voltage. The output of the threshold detector is typically a rectangular pulse train oscillating between two voltage levels. The first voltage level indicates that the input to the threshold detector does not exceed the predetermined threshold and the second voltage level indicates that the input exceeds the predetermined threshold. The width of each rectangular pulse is indicative of the duration of time that the input signal spent above the threshold.

The three input comparator 32 compares the outputs of each of the three threshold detectors and generates a signal indicative of a potential fault if the differences between the three signals exceed a specified tolerance level. Typically the three input comparator will generate a first signal indicating the absence of fault and a second signal indicating the existence of a potential fault. In several embodiments, the phase difference in each of the load currents is accounted for when performing comparison.

The output of the three input comparator 32 forms the input to the fault verification circuitry 26. The integrator 34 in the fault verification circuitry integrates the output of the three input comparator. In one embodiment, the integrator is cleared whenever the three input comparator output indicates that there are no faults. Therefore, the output of the integrator remains at a first value until the comparator detects a potential fault and then will increase for as long as the potential fault is detected by the three input comparator. As soon as the potential fault abates, the integrator is cleared and the output returns to the first voltage level.

The output of the integrator is provided to a comparator, which compares the output to a predetermined reference value. If the integrator output remains below the predetermined reference value, then the comparator outputs a first signal. If the integrator output exceeds the reference value, then the comparator generates a second signal. The amplitude of the integrator output is indicative of the duration of the potential fault, therefore, comparing this value to the predetermined reference value enables a determination to be made as to whether the duration of the fault has exceeded a predetermined time period.

Figure 4:
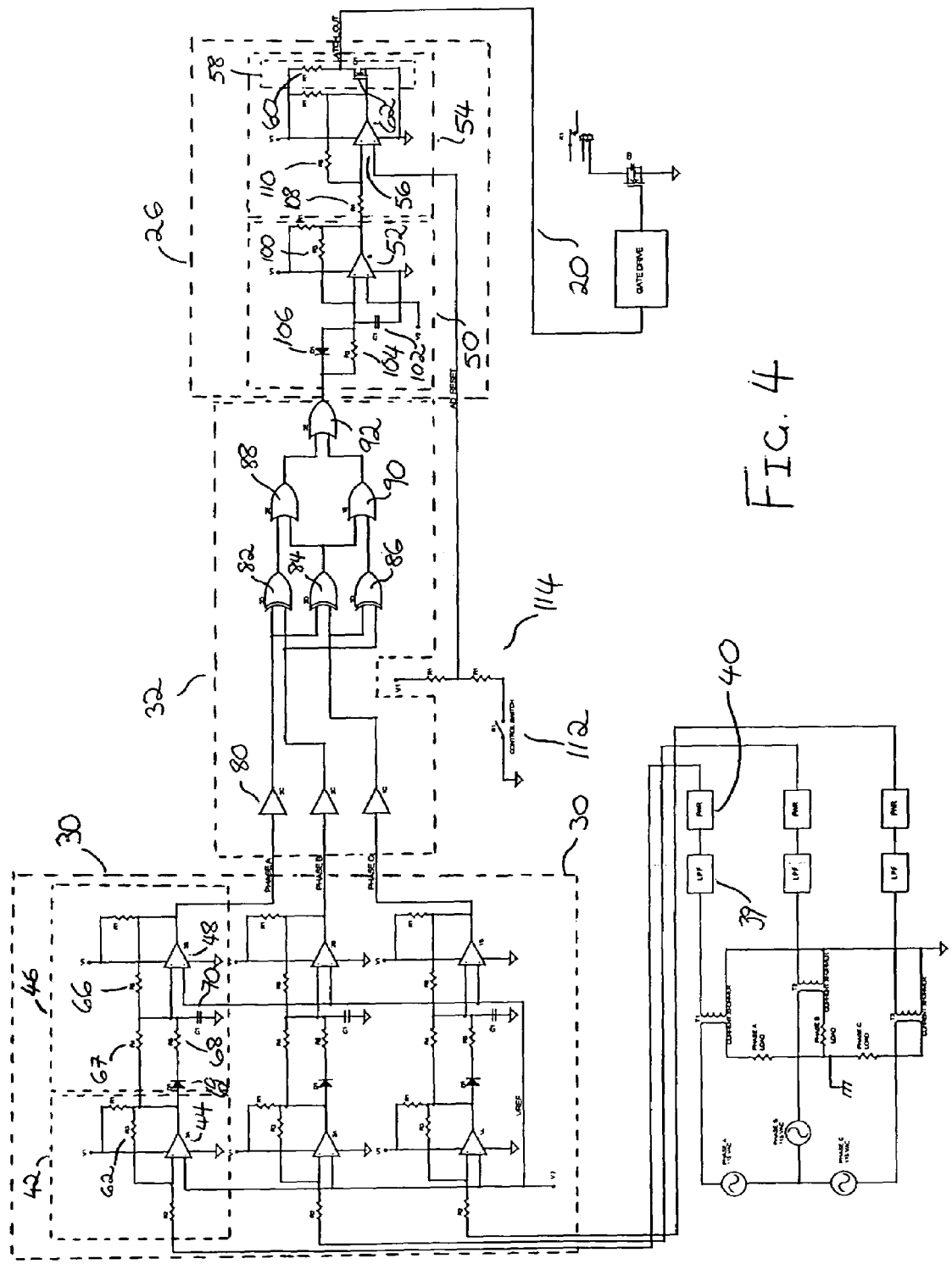
FIG. 4 is a circuit diagram of an arc fault detector constructed in accordance with an embodiment of the present invention.

A circuit diagram showing an implementation of an embodiment of an arc fault detector in accordance with the present invention is illustrated in FIG. 4. The arc fault detector 10 includes three filters 39 and three full wave rectifiers 40. The filters are implemented using passive elements and the full wave rectifiers are implemented using operational amplifiers, although one of ordinary skill in the art would appreciate that any number of active or passive circuits could be used to implement these elements of the circuit. The outputs of the full wave rectifiers are provided to threshold detectors 30 that include a pulse width converter stage 42 implemented using a comparator circuit 44 and a comparison stage 46 that is also implemented using a comparator circuit 48. The outputs of the threshold detector stage are passed to a three input comparator 32, which is implemented using discrete logic gates in the manner described below. The output of the three input comparator 32 is provided to an integration stage 50 that is implemented using a comparator circuit 52. The output of the integration stage is then provided to a verification stage 54 that is also implemented using a comparator circuit 56, which can provide a signal for opening a relay (not shown).

In the embodiment shown in FIG. 4, the load currents are provided by a 115V, 400 Hz three phase power supply. Each phase of the load current is monitored by a current transformer and the output of the current transformer is filtered and rectified. In one embodiment, the filters 39 are passive and have a −6 dB cutoff point at 800 Hz.

The output of the full wave rectifiers 40 are supplied to the pulse width converter stage 42. The pulse width converter stage generates a pulse width modulated square wave for each of the current phases, where the width of the pulses are proportional to the time a current phase exceeds a predetermined threshold. In one embodiment, the pulse width converter stage 42 is implemented using three comparators 44 that each use a resistor 62 to generate positive feedback from their outputs to their non-inverting inputs. In addition, the inverting input of each comparator is connected to a reference voltage that establishes the predetermined threshold. The output of each comparator is driven to the positive rail, whenever the voltage at the non-inverting input exceeds the reference voltage.

The output of the pulse width converter stage is connected to the comparison stage 46. The comparison stage is implemented using three comparator circuits 48. The non-inverting input of each comparator circuit is connected to the comparator output via a resistor 66 to create a positive feedback loop. The non-inverting input is also connected to the output of a comparator 44 from the pulse width converter stage by a resistor 67 in parallel with a resistor 68 connected in series with a diode 69. The non-inverting input of each comparator 48 is also connected to ground via a capacitor 70. The inverting input of the comparator is connected to a predetermined reference voltage.

Charge accumulates on the capacitor when the output of a comparator 44 from the pulse width converter stage is at the positive rail (i.e. indicating that the threshold voltage has been exceeded). The capacitor discharges when the output of the comparator 44 is at the negative rail (i.e. indicating that the threshold voltage has not been exceeded). The positive feedback loop causes the output of the comparator circuit 48 to be driven to the positive rail if the voltage drop across the capacitor is larger than the reference voltage at the inverting input. Otherwise, the output of the comparator circuit 48 is driven to the negative rail.

The three phase nature of the load current implies that the peak amplitudes of each load current will not occur simultaneously. Simply comparing each of the phases could result in nuisance trips on account of the phase difference being interpreted as a current imbalance. By integrating each load current over at least one cycle, the effect of the phase difference between the load currents is removed. The time at which the three current loads exceed the predetermined threshold can then be compared. The number of cycles over which the output of each of the pulse width converter stages is integrated can be chosen to be the smallest time required to prevent nuisance trips due to the phase offset of each of the three phases. The time over which each current load is integrated is controlled by the reference voltage and the capacitor 70 and resistor 67 that are connected to the comparator 48.

In one embodiment, the reference voltage and resistive loads are chosen such that the voltage across the capacitor 70 will equal the reference voltage at the inverting input of the comparator 48 when the measured current through the load is 150% of the system load current for a period of less than 1 millisecond and as much as 11 milliseconds depending upon the amplitude of the load current. One of ordinary skill in the art would appreciate that the pulse width converter stage and the comparison stage can be implemented using a comparator or an operational amplifier in any number of configurations.

The output of the comparison stage is provided to the three input comparator 32, which is implemented using digital logic gates. The purpose of the three input comparator is to detect imbalances between the three current phases. In the illustrated embodiment this is achieved by comparing the outputs of the three comparator stages. The outputs are buffered 80 to isolate the comparator stage circuitry from the logic gates used to implement the three input comparator. The outputs from the comparator stages that are indicative of the first and second phases are provided to a first XOR gate 82, which generates a logic 1 when these signals do not correspond and a logic 0 when they are the same. Another XOR gate 84 performs the same function using the signals from the comparator stages indicative of the first and third current phases as inputs and a third XOR gate 86 accepts the signals indicative of the second and third current phases as inputs. The outputs of the XOR gate 82 and the XOR gate 84 are provided as inputs to an OR gate 88, which generates a logic 1 if either or both of the XOR gates generate a logic 1 output. A second OR gate 90 accepts outputs from the XOR gate 84 and the XOR gate 86 as inputs and the outputs of both OR gates are provided to a third OR gate 92. The three OR gates essentially function as a three input OR gate that generates a logic 1 output when a logic 1 signal is provided to any one of its inputs. Other configurations of logic circuits can be used to compare the outputs of the threshold detectors 30, including any implementation of a 3-input XOR gate. The particular configuration described above has the property that each signal experiences similar propagation delays.

The output of the three input comparator is provided to the input of the integration stage 50, which is implemented using the comparator circuit 52. A resistor 100 is used to provide feedback to the non-inverting input of the comparator, which is connected to ground via a capacitor 102. The non-inverting input is also connected to the output of the three input comparator via a resistor 104 in parallel with a diode 106. When the output of the three input comparator 32 is a logic 1, charge collects on the capacitor 102 and its voltage rises. The capacitor discharges when the output of the three input comparator 52 is a logic 0. When the voltage across the capacitor exceeds the predetermined reference voltage provided to the inverting input of the three input comparator 52, the output of the three input comparator 52 is driven to the positive rail. In the absence of this condition, the comparator output is driven to the negative rail.

As described above, certain types of current imbalances are unrelated to high level arc faults. Nuisance trips associated with several of these types of current imbalances can be avoided by ignoring all potential faults that persist for a time period less than a predetermined time period. In the illustrated embodiment, the third comparator stage ensures that a fault signal is not generated until sufficient charge has accumulated on the capacitor 102. The delay between the first indication of a potential fault by the three input comparator stage and the generation of a fault signal by the integration stage is determined by the capacitor 102 and the resistor 104.

The output of the integration stage 50 is provided to the switching stage 54, which is implemented using the comparator circuit 56. The non-inverting input of the compartor circuit 56 is connected to the output of the third comparator stage via a resistor 108. Another resistor 110 provides feedback from the output of the comparator circuit to the non-inverting input of the comparator circuit. The inverting input of the comparator is connected to a voltage divider 114 that is connected to ground via a switch 112. The switch can be used to enable the arc fault detector.

When the switch 112 enables the arc fault detector, the voltage at the inverting input of the comparator circuit 56 will be less than the output from the third comparator stage that indicates the presence of a fault and, consequently, the presence of a fault will cause the output of the comparator 56 to be driven to the positive voltage rail. If the switch is not enabled, then the voltage at the inverting input of the comparator will be at the positive rail and the attenuating effect of the resistor 108 will ensure that the input at the non-inverting input of the comparator is always less than this value and the output of the comparator is always at the negative rail.

The output of the comparator circuit 56 is connected to the gate of a n-channel enhancement mode MOSFET 62. The drain of the MOSFET is connected to the positive power rail by a resistor 60 and the source is connected directly to the negative rail, which is connected to ground in the illustrated embodiment. When the output of the comparator circuit 56 is driven to the negative rail, the gate-source voltage of the MOSFET is 0V, which is insufficient to turn the MOSFET on. When the MOSFET is turned off, current flows in the connection 20. When the output of the comparator circuit 56 is driven to the positive rail, the gate-source voltage of the MOSFET is sufficient to turn the MOSFET on and the resistor 60 is shorted to ground through the MOSFET. As described above, the output of the comparator circuit 56 is driven to the positive voltage rail when an arc fault is detected by the integration stage and the switch 112 is in the arc fault detector enabled position.

According to the above description, a current in the connection 20 is indicative of the absence of a fault. When an arc fault occurs, current ceases to flow in the connection 20 and the relay control circuitry (not shown) can respond by breaking the connection between the power supply 12 and the load 14.

Figure 5:
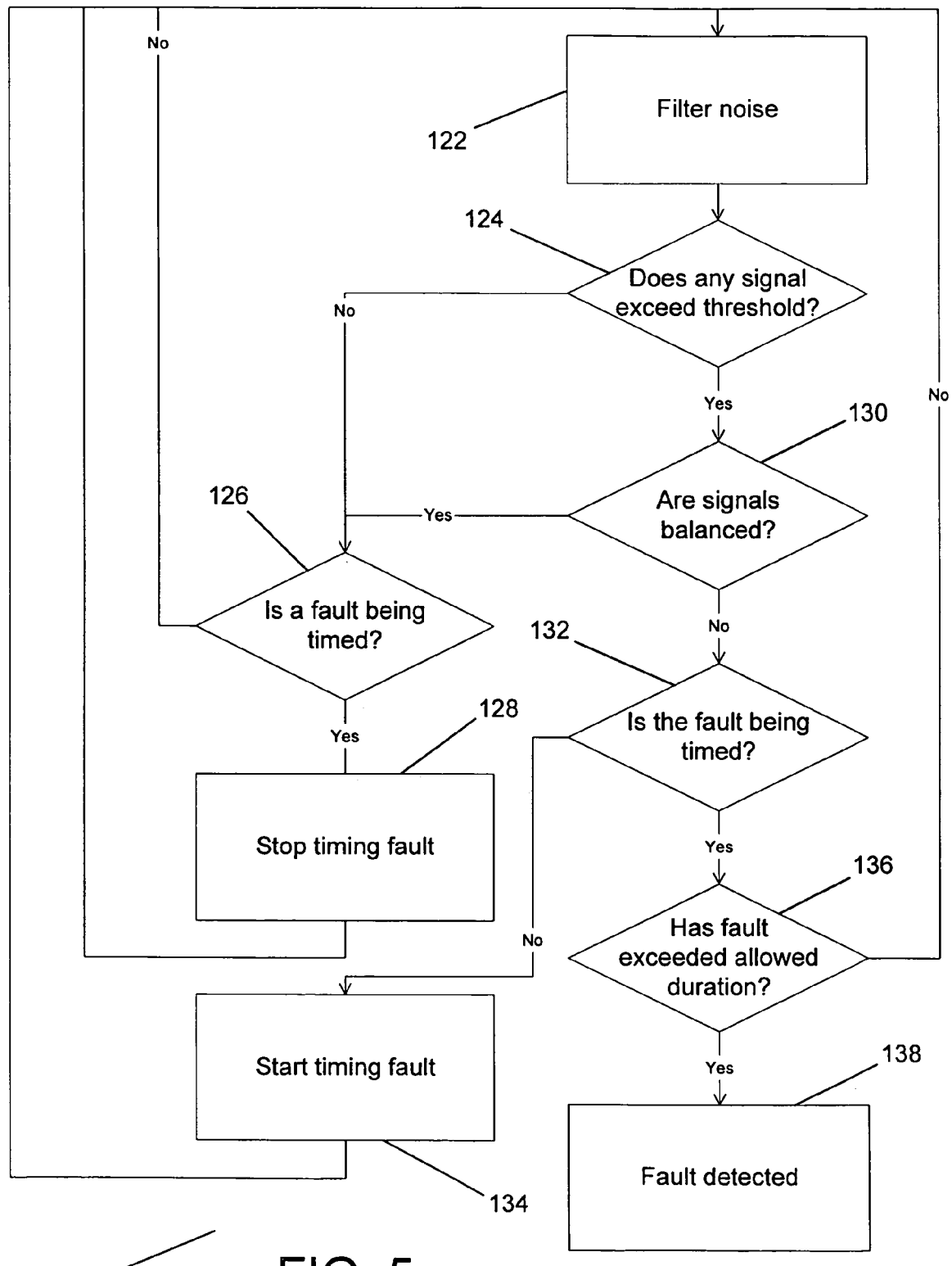
FIG. 5 illustrates a method of detecting arc faults in a three phase aircraft power system in accordance with the present invention.

A process 120 for detecting arc faults in accordance with the present invention is illustrated in FIG. 5. The process (120) involves rectifying (122) signals indicative of the three current phases and then comparing (124) the filtered signals to a predetermined threshold. If none of the filtered signals exceed the threshold, then a determination (126) is made as to whether a fault is being timed. The importance of this determination is that a potential fault may previously have been detected and therefore, the timing of that potential fault should cease (128). In either case involving signals that do not exceed the threshold, the process returns to monitoring the three current phases.

If one of the signals exceeds (124) the predetermined threshold, then the filtered signals are compared (130) to determine whether they are balanced. If the signals are balanced, then the system returns to monitoring the current in the manner described above by stopping any timing of previously identified potential faults (126 and 128). When the filtered signals are imbalanced, a determination (132) is made whether a potential fault is already being timed. If a potential fault is not being timed, then the process commences timing the fault (134) and continues to monitor the three current phases. If a potential fault is being timed, then the time during which the potential fault has persisted is compared (136) to a predetermined time period. If the duration of the potential fault exceeds the predetermined time period then a fault is detected (138), otherwise, the process continues to monitor the three phase current.

While the above description contains many specific embodiments of the invention, these should not be construed as limitations on the scope of the invention, but rather as an example of one embodiment thereof. For example, the embodiments described above are implemented using a combination of analog and digital components. In other embodiments, the functions of the arc fault detector can also be performed using a microprocessor or an application specific integrated circuit. In addition, processing could be performed entirely in the digital domain by sampling the inputs of the arc fault detector and performing digital filtering and signal analysis. Accordingly, the scope of the invention should be determined not by the embodiments illustrated, but by the appended claims and their equivalents.

What is claimed is:

1. An arc fault detector for detecting arc faults in three phase aircraft power systems, comprising:
  three full wave rectifiers, each of the three full wave rectifiers having an input of a load current in the three phase power system and having an output connected to one of a plurality of threshold detectors;
  a three input comparator having at least three inputs, each of the least three inputs being connected to an output of one of the plurality of threshold detectors; and
  a fault verification circuit connected to an output of the three input comparator.

2. The arc fault detector of claim 1, wherein each of the plurality of threshold detectors comprises:
  a first comparator having: a first input connected to an output of one of the full wave rectifiers; a second input connected to a signal indicative of a predetermined threshold; and
  an output.

3. The arc fault detector of claim 2, wherein each of the plurality of threshold detectors further comprise an integrator configured to integrate the output of the first comparator.

4. The arc fault detector of claim 1, wherein the three input comparator is configured to generate a signal indicative of the outputs of any two of the threshold detectors differing by more than a predetermined amount.

5. The arc fault detector of claim 1, wherein the fault verification circuit comprises:
  an integrator connected to the output of the three input comparator; and a comparator connected to the output of the integrator and configured to generate a signal indicative of the detection of a fault, when the output of the integrator exceeds a predetermined threshold.

6. An arc fault detector for detecting arc faults in three phase aircraft power systems; comprising:
   means for generating three load currents in the three phase system, where each load current in the three phase system is indicative of each of the three phases;
   means for rectifying the generated load currents;
   mean for comparing the three rectified load currents;
   means for generating a signal in response to the three rectified load currents differing for a time period exceeding a predetermined duration; and
   means for detecting that one of the three rectified currents exceeds a predetermined threshold, wherein the means for generating a signal in response to the three rectified load currents differing for a time period exceeding a predetermined duration generates a signal if at least one of the three filtered load current exceeds the predetermined threshold.

7. A method of detecting arc faults in three phase aircraft power systems, comprising:
   detecting when at least one of the three load currents in the three phase power system has a current exceeding a predetermined threshold;
   detecting differences between the three load currents; and
   generating a signal indicative of differences being detected between the three load currents for a time period exceeding a predetermined duration;
   wherein the detecting differences comprises generating load currents in the three chase system, each load current indicative of one of the three phases and generating a signal indicative of at least two of the three load currents differing by more than a predetermined amount, and detecting differences further comprises continuously monitoring the load currents indicative of the three phases.

8. The method of claim 7, wherein detecting differences further comprises continuously sampling the load currents indicative of the three phases.

9. The method of claim 7, wherein generating a signal indicative of at least two of the three load currents differing by more than a predetermined amount comprises integrating over at least one cycle each of the load currents indicative of each of the three phases.

10. The method of claim 9, wherein generating a signal indicative of at least two of the three load currents differing by more than a predetermined amount further comprises:
   comparing the magnitude of each load current to a predetermined threshold; and
   generating a signal for each load current indicative of the magnitude of the load current relative to the threshold.

11. The method of claim 7, wherein generating a signal indicative of differences being detected between the three load currents for a time period exceeding a predetermined duration comprises:
   generating a signal indicative of the time period during which at least two of the three load currents differ by more than a predetermined amount; and
   comparing the generated signal to a signal indicative of the predetermined duration.

* * * * *